(12) United States Patent
Nogawa et al.

(10) Patent No.: US 12,587,176 B2
(45) Date of Patent: Mar. 24, 2026

(54) LINEAR GATE CURRENT BUFFER FOR PARALLEL POWER DEVICE DRIVING APPLICATIONS

(71) Applicant: Qorvo US, Inc., Greensboro, NC (US)

(72) Inventors: Masashi Nogawa, Sachse, TX (US); Michael Negrete, Sunnyvale, CA (US)

(73) Assignee: Qorvo US, Inc., Greensboro, NC (US)

( * ) Notice: Subject to any disclaimer, the term of this patent is extended or adjusted under 35 U.S.C. 154(b) by 145 days.

(21) Appl. No.: 18/593,396

(22) Filed: Mar. 1, 2024

(65) Prior Publication Data

US 2024/0313745 A1 Sep. 19, 2024

Related U.S. Application Data

(60) Provisional application No. 63/452,935, filed on Mar. 17, 2023.

(51) Int. Cl.
H02K 17/22 (2006.01)
H03K 3/013 (2006.01)
H03K 17/687 (2006.01)

(52) U.S. Cl.
CPC ......... H03K 3/013 (2013.01); H03K 17/6872 (2013.01)

(58) Field of Classification Search
CPC ........................... H03K 3/013; H03K 17/6872
See application file for complete search history.

(56) References Cited

U.S. PATENT DOCUMENTS

| | | | |
|---|---|---|---|
| 5,017,816 A | 5/1991 | Wilcox | |
| 5,543,739 A | 8/1996 | Bontempo et al. | |
| 10,917,081 B1 | 2/2021 | Nguyen et al. | |
| 11,057,029 B2 | 7/2021 | Westwick et al. | |
| 11,303,273 B2 | 4/2022 | Shen et al. | |
| 2010/0026257 A1 | 2/2010 | Huang et al. | |
| 2010/0141326 A1* | 6/2010 | Tumminaro | H03K 17/163 |
| | | | 327/374 |
| 2015/0085403 A1 | 3/2015 | Santos et al. | |
| 2015/0381167 A1* | 12/2015 | Sicard | H03K 17/687 |
| | | | 327/109 |
| 2018/0069546 A1 | 3/2018 | Shankar | |
| 2019/0312505 A1* | 10/2019 | Li | H02M 3/156 |

(Continued)

FOREIGN PATENT DOCUMENTS

| | | | | |
|---|---|---|---|---|
| CA | 3116485 A1 * | 10/2021 | ......... | H10D 62/8503 |

*Primary Examiner* — Muhammad S Islam

(74) *Attorney, Agent, or Firm* — Withrow & Terranova, P.L.L.C.

(57) ABSTRACT

Embodiments of a power switching system are disclosed. In some embodiments, the power switching system includes a power transistor, a current buffer, and a driver circuit. The power transistor has a first control terminal, a first transistor terminal, and a second transistor terminal. The current buffer is configured as a current amplifier that results in a voltage at the first control terminal. The current buffer has a second control terminal. The driver circuit has a first circuit branch connected to the second control terminal and a second circuit branch connected to the second control terminal. The first circuit branch includes a first switch for opening and closing the first circuit branch. The second circuit branch includes a second switch and a current source, wherein the second switch is configured to open and close the second circuit branch.

19 Claims, 6 Drawing Sheets

(56)  References Cited

U.S. PATENT DOCUMENTS

| 2020/0259490 A1 * | 8/2020 | Murphy .................... H03F 3/20 |
| 2021/0305927 A1 | 9/2021 | Kirby et al. |
| 2022/0190818 A1 | 6/2022 | Heckroth et al. |
| 2022/0190821 A1 | 6/2022 | Tesu et al. |

* cited by examiner

ABNORMAL "SLOW" OFF $$\frac{\Delta I}{\Delta t} = \frac{500A}{500ns}$$

LINEAR GATE CURRENT BUFFER FOR PARALLEL POWER DEVICE DRIVING APPLICATIONS

RELATED APPLICATIONS

This application claims the benefit of provisional patent application Ser. No. 63/452,935, filed Mar. 17, 2023, the disclosure of which is hereby incorporated herein by reference in its entirety.

FIELD OF THE DISCLOSURE

This disclosure relates generally to integrated circuit (IC) devices that drive power transistors.

BACKGROUND

To drive large power transistors using a gate driver, a current buffer is used to provide current amplification. To prevent false on events due to the Miller capacitance once these power transistors are turned off, large Field Effect Transistors (FETs) are used to create a hard off and prevent the power transistor from being turned on incorrectly. These FETs are large and take up a significant amount of space. Thus, what is needed are techniques for preventing false on situations in a power transistor without requiring large FETs.

SUMMARY

A power switching system, includes: a power transistor having a first control terminal, a first transistor terminal, and a second transistor terminal; a current buffer that is configured as a current amplifier that results in a voltage at the first control terminal, the current buffer having a second control terminal; and a driver circuit having a first circuit branch connected to the second control terminal and a second circuit branch connected to the second control terminal, wherein: the first circuit branch includes a first switch for opening and closing the first circuit branch; and the second circuit branch includes a second switch and a current source, wherein the second switch is configured to open and close the second circuit branch. In some embodiments, the power transistor is a Silicon Carbide transistor or a Gallium Nitride field effect transistor. In some embodiments, the power transistor is a field effect transistor, wherein the first control terminal is a gate, the first transistor terminal is a source, and the second transistor terminal is a drain. In some embodiments, the current buffer includes current mirror circuitry coupled between the second control terminal and the gate. In some embodiments, the current mirror circuitry includes: a first current mirror, which includes an input P-channel field effect transistor (PFET) and an output PFET, wherein the input PFET is connected to the second control terminal; and a second current mirror which includes an input N-channel field effect transistor (NFET) and an output NFET, wherein the input NFET is coupled to the output PFET and the output NFET is coupled to the gate of the power transistor. In some embodiments, the power switching system includes a control circuit configured to: close the second switch and open the first switch to generate a turn off voltage at a gate; and open the second switch and close the first switch to prevent a Miller capacitance of the power transistor from activating the power transistor. In some embodiments, the driver circuit further includes a third circuit branch including a third switch for opening and closing the third circuit branch and a second current source, wherein: the current source in the second circuit branch is a first current source; the first current source generates a first current having a first current level; and the second current source generates a second current having a second current level, wherein the second current level is less than the first current level. In some embodiments, the power switching system includes a control circuit configured to: detect that the power transistor is to be turned off; close the second switch in the second circuit branch for a first time period in response to detecting that the power transistor is to be turned off and in response to detecting that a drain current of the power transistor is below a threshold current level; and close the third switch in the third circuit branch for a second time period in response to detecting that the power transistor is to be turned off and in response to detecting that the drain current of the power transistor is above the threshold current level, wherein the second time period is longer than the first time period. In some embodiments, the current buffer further includes: a third control terminal; a first current mirror which includes a first input NFET and a first output NFET, wherein the first input NFET is coupled to the third control terminal; a second current mirror which includes an input PFET and an output PFET, wherein the input PFET is connected to the first output NFET; and a third current mirror which includes a second input NFET and a second output NFET, wherein the second input NFET is coupled to the output PFET and the second output NFET is coupled to the first control terminal. In some embodiments, the power transistor is a Silicon Carbide junction field effect transistor (JFET). In some embodiments, the Silicon Carbide JFET includes a source, a drain, and a gate, wherein the gate is the first control terminal. In some embodiments, the first switch is a first complementary metal oxide semiconductor (CMOS) switch and the second switch is a second CMOS switch. In some embodiments, the driver circuit is an integrated circuit (IC). In some embodiments, the current buffer is also part of the IC or a second IC. In some embodiments, the power switching system is formed in an IC. In some embodiments, the driver circuit further includes a third circuit branch having a third switch and a second current source, wherein: the current source is a first current source and the third circuit branch is connected to the second control terminal. In some embodiments, the first switch is a first CMOS switch, the second switch is a second CMOS switch, and the third switch is a third CMOS switch. In some embodiments, the power transistor is larger than the first CMOS switch, the power transistor is larger than the second CMOS switch, and the power transistor is larger than the third CMOS switch.

In some embodiments for a method of operating a power transistor, the method includes: operating a current buffer as a current amplifier that results in a voltage at a first control terminal of the power transistor, the current buffer having a second control terminal; opening a first switch and closing a second switch to generate a turn off voltage at the first control terminal; a first circuit branch including the first switch for opening and closing the first circuit branch and a second circuit branch including the second switch and a current source, wherein the second switch is configured to open and close the second circuit branch; and opening the second switch and closing the first switch to prevent a Miller capacitance of the power transistor from activating the power transistor.

A motor system that includes a field effect transistor (FET) driving block, the FET driving block includes: a power transistor having a first control terminal, a first transistor terminal, and a second transistor terminal; a current buffer being configured as a current amplifier that results in a voltage at the first control terminal, the current buffer having a second control terminal; and a driver circuit having a first circuit branch connected to the second control terminal and a second circuit branch connected to the second control terminal, wherein: the first circuit branch includes a first switch for opening and closing the first circuit branch; and the second circuit branch includes a second switch and a current source, wherein the second switch is configured to open and close the second circuit branch and the current source.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
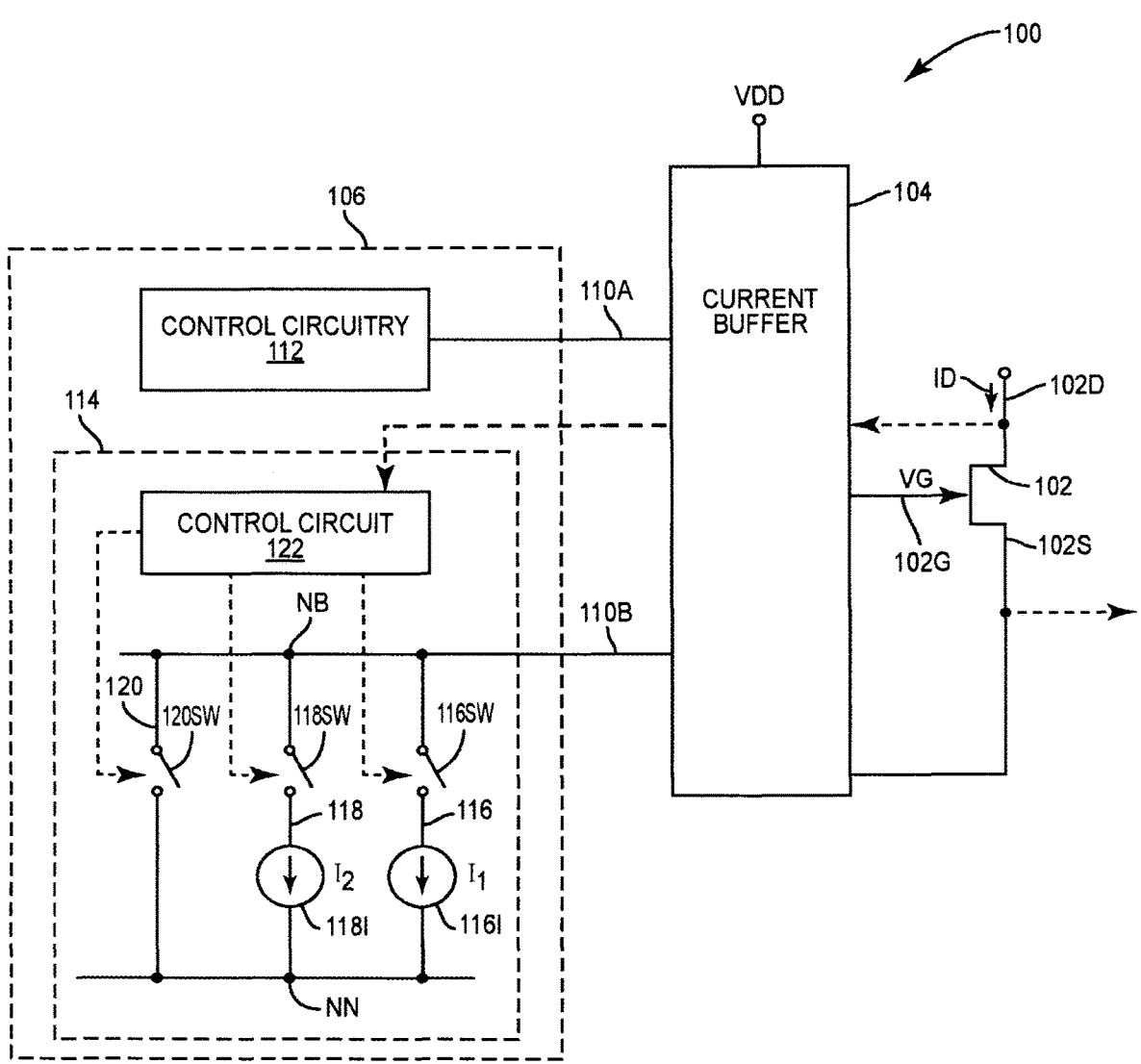
FIG. 1 is an integrated circuit (IC) device, in accordance with some embodiments.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

FIG. 1 is an integrated circuit (IC) device 100, in accordance with some embodiments.

The IC device 100 is also referred to as a power switching system 100. The IC device 100 includes a power transistor 102, a current buffer 104, and a driver circuit 106. The power transistor 102 is, in general, a large transistor. The power transistor 102 includes a control terminal 102G, a transistor terminal 102D, and a transistor terminal 102S. In this embodiment, the power transistor 102 is a Junction field effect transistor (JFET) and is also an N-channel field effect transistor (NFET). In other embodiments, the power transistor 102 is another type of power transistor such as a Gallium Nitride field effect transistor. In other embodiments, the power transistor is a P-channel field effect transistor (PFET). Since the power transistor 102 is a field effect transistor (FET), the control terminal 102G is a gate, the transistor terminal 102D is a drain, and the transistor terminal 102S is a source. In some embodiments, the power transistor 102 is used to power components such as electric motors, a DC to DC converter, or an AC to DC converter.

To drive the power transistor 102 without using transistors as large as the power transistor 102, the current buffer 104 is provided to amplify current signals from the driver circuit 106. The current buffer 104 creates sufficient current so as to turn on and turn off the power transistor 102. In turn, the current buffer 104 is configured to generate a gate voltage VG at the gate 102G of the power transistor 102 by amplifying currents in control circuitry 112 and control circuitry 114. The control circuitry 112 provides currents that generate the gate voltage VG in order to pull up the gate voltage VG towards a power source voltage VDD. The control circuitry 112 is provided in accordance with U.S. Provisional Patent Application Ser. No. 63/385,332 named "Adaptive Dead Time Control For Switching Circuitry of a DC Converter" filed Nov. 29, 2022 and U.S. Provisional Patent Application Ser. No. 63/434,189 named "Using Different Voltage Levels to Close a Switch in a Switch Converter" filed Nov. 10, 2022, in accordance with some embodiments. U.S. Provisional Patent Application Ser. No. 63/385,332 named "Adaptive Dead Time Control for Switching Circuitry of a DC Converter" filed Nov. 29, 2022, and U.S. Provisional Patent Application Ser. No. 63/434,189 named "Using Different Voltage Levels to Close a Switch in a Switch Converter" filed Nov. 10, 2022, are each hereby incorporated by reference in their entireties.

Again, the current buffer 104 operates as a current amplifier that results in the voltage VG at the gate 102G of the power transistor 102 that controls the operation of the power transistor 102. The control circuitry 114 is connected to the current buffer 104 at a control terminal 110A. In some embodiments, the current buffer 104 has a current gain of around 100. The control circuitry 114 includes a circuit branch 116, a circuit branch 118, a circuit branch 120, and a control circuit 122. Each of the circuit branches 116, 118, 120 are connected between a node NB and a node NN. The node NB is connected to a control terminal 110B of the current buffer 104. In some embodiments, the node NN is at ground or at a negative voltage. The circuit branch 116 includes a switch 116SW and a current source 116I. The switch 116SW and the current source 116I are connected in series within the circuit branch 116. The switch 116SW is operable to be opened and closed by the control circuit 122 in order to open and close the circuit branch 116. The current source 116I generates a current I1 having a first current level. The circuit branch 118 includes a switch 118SW and a current source 118I. The switch 118SW and the current source 118I are connected in series within the circuit branch 118. The switch 116SW is operable to be opened and closed by the control circuit 122 in order to open and close the circuit branch 118. The current source 118I generates a current I2 having a second current level. The second current level is less than the first current level. The circuit branch 120 includes a switch 120SW. The switch 120SW is operable to be opened and closed by the control circuit 122 in order to open and close the circuit branch 120. In some embodiments, the power transistor 102 is at least 100 times larger than each of the switches 116SW, 118SW, 120SW, individually.

Figure 2:
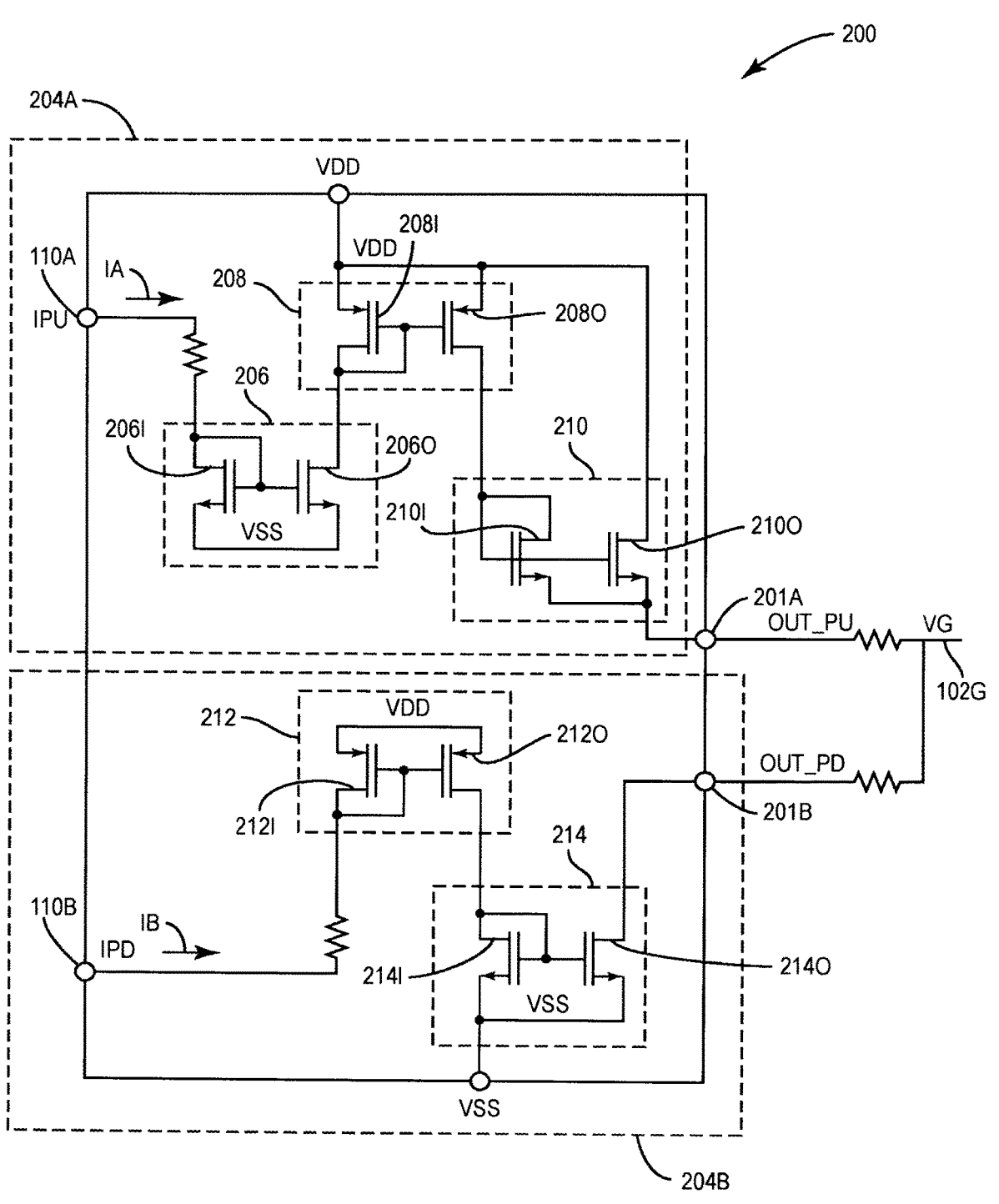
FIG. 2 is a circuit buffer, in accordance with some embodiments.

FIG. 2 illustrates a current buffer 200, in accordance with some embodiments.

In some embodiments, the current buffer 104 is provided as the current buffer 200 shown in FIG. 2. The current buffer 200 thus includes the control terminal 110A (i.e., IPU) and the control terminal 110B (e.g., IPD) as shown in FIG. 1. The current buffer 200 includes an output terminal 201A (i.e., OUT_PU) and an output terminal 201B (i.e., OUT_PD). Both the output terminal 201A and 201B are coupled to the gate 102G of the power transistor 102. The current buffer 200 generates the gate voltage VG at the output terminal 201A in order to pull up the gate voltage VG towards the power source voltage VDD. The current buffer 200 generates the gate voltage VG at the output terminal 201B in order to pull down the gate voltage VG towards the reference voltage VSS. In some embodiments, the reference voltage VSS is ground. In some embodiments, the power source voltage has a non-zero voltage magnitude and a positive voltage polarity.

The current buffer 104 includes current mirror circuitry 204A and current mirror circuitry 204B. The current mirror circuitry 204A includes a current mirror 206, a current mirror 208, and a current mirror 210.

The current mirror 206 includes an input NFET 206I and an output NFET 206O. The gate of the input NFET 206I is directly connected to the drain of the input NFET 206I. The source of the input NFET 206I is connected to receive the reference voltage VSS. The gate of the output NFET 206O is directly connected to the gate of the input NFET 206I. The source of the output NFET 206O is connected to receive the reference voltage VSS. The drain and the gate of the input NFET 206I are coupled to the control terminal 110A. The drain of an output NFET 206O is connected to the current mirror 208.

The current mirror 208 is connected between the current mirror 206 and the current mirror 210. The current mirror 208 includes an input PFET 208I and an output PFET 208O. The gate of the input PFET 208I is directly connected to the drain of the input PFET 208I. The source of the input PFET 208I is connected to receive the power source voltage VDD. The gate of the output PFET 208O is directly connected to the gate of the input PFET 208I. The source of the output PFET 208O is connected to receive the power source voltage VDD. The drain and the gate of the input PFET 208I are coupled to the drain of the output NFET 206O. The drain of the output PFET 208O is connected to the current mirror 210.

The current mirror 210 includes an input NFET 210I and an output NFET 210O. The gate of the input NFET 210I is directly connected to the drain of the input NFET 210I. The source of the input NFET 210I is connected to receive the reference voltage VSS. The gate of the output NFET 210O is directly connected to the gate of the input NFET 210I. The source of the output NFET 210O is connected to receive the reference voltage VSS. The drain and the gate of the input NFET 210I are coupled to the drain of the output PFET 208O. The source of the output NFET 210O and the drain of the input NFET 210I are connected to the output terminal 201A. The current mirrors 206, 208, 210 are configured to pull up the voltage VG to the appropriate voltage level in response to a current IA received at the control terminal 110A. In some embodiments, the current mirrors 206, 208, 210 provide a current gain to the current IA of 10 or more.

The current mirror circuitry 204B includes a current mirror 212 and a current mirror 214. The current mirror 212 includes an input PFET 212I and an output PFET 212O. The gate of the input PFET 212I is directly connected to the drain of the input PFET 212I. The source of the input PFET 212I is connected to receive the power source voltage VDD. The gate of the output PFET 212O is directly connected to the gate of the input PFET 212I. The source of the output PFET 212O is connected to receive the power source voltage VDD. The drain and the gate of the input PFET 212I are coupled to the control terminal 110B. The drain of the output PFET 212O is connected to the current mirror 212.

The current mirror 214 includes an input NFET 214I and an output NFET 214O. The gate of the input NFET 214I is directly connected to the drain of the input NFET 214I. The source of the input NFET 214I is connected to receive the reference voltage VSS. The gate of the output NFET 214O is directly connected to the gate of the input NFET 214I. The source of the output NFET 214O is connected to receive the reference voltage VSS. The drain and the gate of the input NFET 214I are coupled to the drain of the output PFET 212O. The drain of the output NFET 214O is connected to the output terminal 201B. The current mirrors 212, 214 are configured to pull down the voltage VG to the appropriate voltage level in response to a current IB received at the control terminal 110B. In some embodiments, the current mirrors 212, 214 provide a current gain to the current IB of 10 or more.

Figure 3:
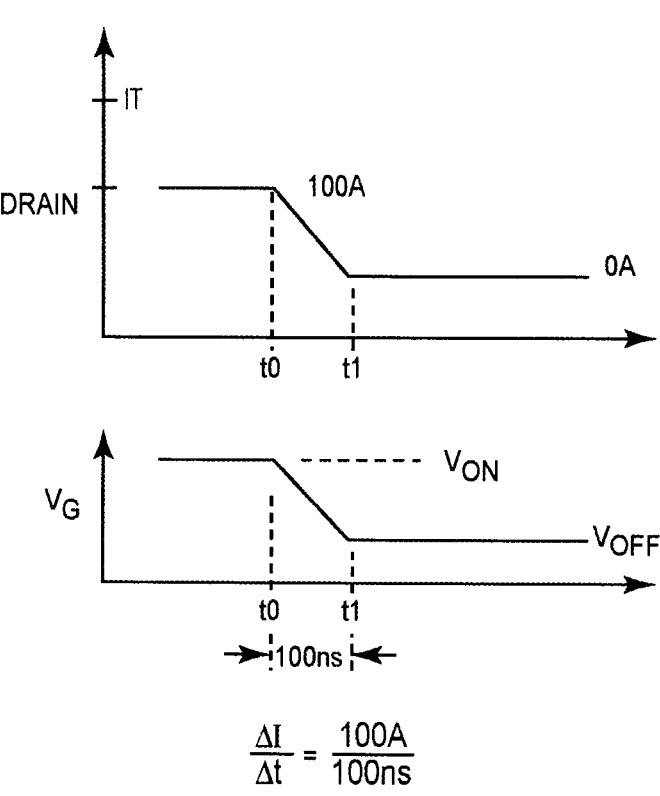
FIG. 3 is a graph of the gate voltage VG at a gate of a power transistor and a drain current ID at a drain of the power transistor during a "normal" turn off operation, in accordance with some embodiments.

Referring now to FIG. 1 and FIG. 3, FIG. 3 is a graph of the gate voltage VG at the gate 102G of the power transistor 102 and a drain current ID at the drain 102D of the power transistor 102 during a "normal" turn off operation, in accordance with some embodiments.

The top graph illustrates the drain current ID during the "normal" turn off operation as a function of time, in accordance with some embodiments. The bottom graph illustrates the gate voltage VG as a function of time, in accordance with some embodiments. The "normal" turn off operation means that the drain current ID at the drain 102D is operating in accordance with typical and normal operational conditions.

To determine whether the drain current ID at the drain 102D is operating in accordance with typical and normal operational conditions, the control circuit 122 is configured to receive a feedback signal from the drain 102D of the power transistor 102. The control circuit 122 is configured to detect whether the drain current ID is less than a threshold current level IT, while the power transistor 102 is on. Here, we assume that the normal current level of the drain current ID while the power transistor 102 is on is 100 Amps. In other embodiments, the power transistor 102 can have any other acceptable value. It is also assumed that 100 Amps is lower than the threshold current level IT.

At time t0, the control circuit 122 closes the switch 116SW while the switches 118SW and the switch 120SW remain open in response to the control circuit 122 detecting that the power transistor 102 is to be turned off and in response to detecting that the drain current ID is below threshold current level. Accordingly, at time t0, the current I1 that is generated by the current source 116I begins to turn the power transistor 102 off. In this embodiment, the current level of the current I1 is generated by the current source 116I so that the power transistor 102, which is generating a current of 100 mA, is turned off in 100 nanoseconds. The control circuit 122 keeps the switch 116SW closed for a time period (e.g., 100 nanoseconds) until time t1, when the drain current ID reaches the current level of 0 Amps to turn off the power transistor 102. In this example, when the power transistor 102 is turned off in 100 ns, we will have dI/dt slew rate of 1 (A/ns). When 100 A-range of current is being generated through the drain 102D of the power transistor 102, any wire or printed circuit board trace may have significant parasitic inductance. As a result, an inductive kick-back voltage is generated that is equal to:

$$V(\text{kickback})=L(\text{parasitic})\times dI/dt.=L\times 1 \text{ (A/ns)}$$

To avoid this kickback voltage becoming bigger and causing unacceptable parasitic inductance, the dI/dt is maintained in a reasonable range and, thus, the time period is sufficient to prevent unacceptable V(kickback). The time period thus ensures that the voltage at the gate 102G is tuned off slowly enough as to not to generate unacceptable parasitic inductance.

In response to the time period ending, the control circuit 122 is configured to close the switch 120SW and open the switches 116SW, 118SW.

In some embodiments, the power transistor 102 has a big gate-drain (parasitic) capacitance. This capacitance is referred to as a Miller capacitance. When the drain current ID goes from a 100 A current to a 0 A during "normal" turn off, the voltage at the drain 102D has a slew rate that generates a transient current. This transient current can cause a false turn on event. To prevent power loss due to this false turn on event, the switch 120SW is closed so that the transient current is absorbed through the current mirror circuitry 204B.

Figure 4:
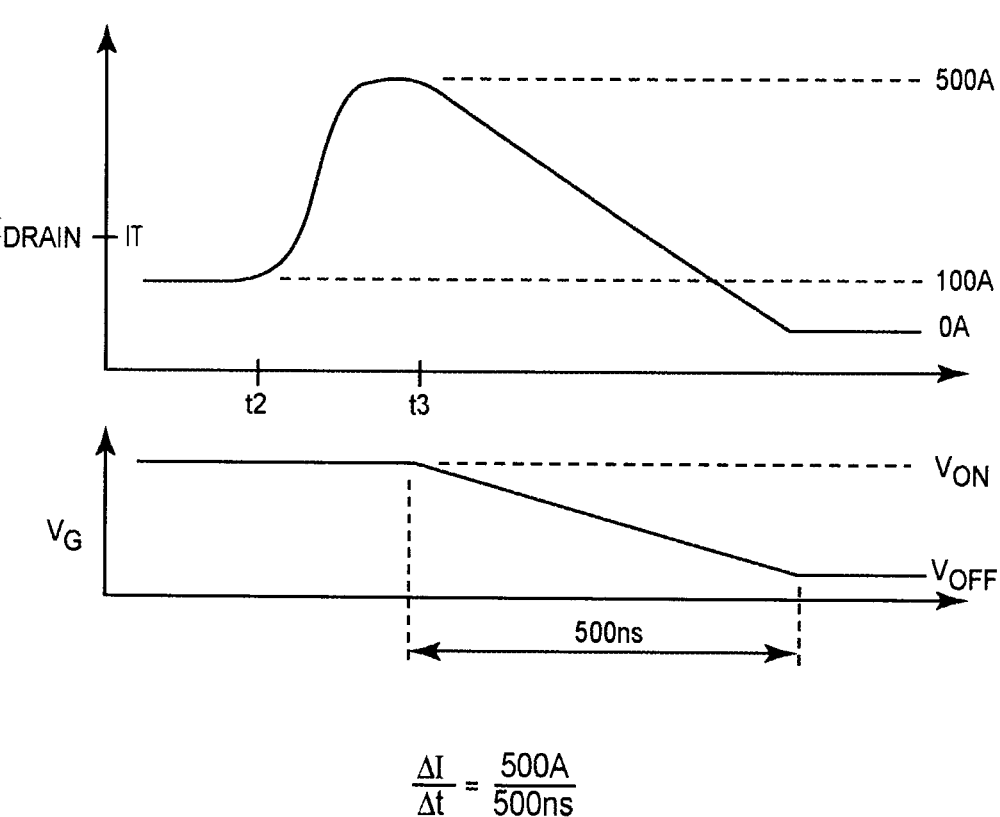
FIG. 4 is a graph of the gate voltage VG at the gate of the power transistor and a drain current ID at the drain of the power transistor during an "abnormal" turn off operation, in accordance with some embodiments.

Referring now to FIG. 1 and FIG. 4, FIG. 4 is a graph of the gate voltage VG at the gate 102G of the power transistor 102 and a drain current ID at the drain 102D of the power transistor 102 during a "abnormal" turn off operation, in accordance with some embodiments.

The top graph illustrates the drain current ID during the "abnormal" turn off operation as a function of time, in accordance with some embodiments. The bottom graph illustrates the gate voltage VG as a function of time, in accordance with some embodiments. The "abnormal" turn off operation means that the drain current ID at the drain 102D reaches current levels that are higher than current levels during typical and normal operational conditions.

To determine whether the drain current ID at the drain 102D is operating in accordance with typical and normal operational conditions, the control circuit 122 is configured to receive the feedback signal from the drain 102D of the power transistor 102. The control circuit 122 is configured to detect whether the drain current ID is greater than the threshold current level IT while the power transistor 102 is on. In this embodiment, the drain current becomes higher than the threshold current level at time t2. The drain current ID continues to rise until the drain current reaches 500 Amps, which is significantly higher than the threshold current level. At time t3, the control circuit 122 detects that the power transistor 102 is to be turned off. Also, at time t3, the control circuit 122 detects that the drain current ID is above the threshold current level.

The control circuit 122 is configured to select the time period for turn off so that the slew rate is equal to the same slew rate during the "normal" turn off operation. As such, since, in this example, the current level is 500 A, the time period is selected to be 500 ns. Accordingly, the control circuit 122 closes the switch 118SW and opens the switches 116SW, 120SW for the time period that results in a matching slew rate. In this example, the current level of the current I2, which is generated by the current source 118I, is lower than the current level of the current I1, which is generated by the current source 116I, to drive the gate 102G of the power transistor 102 to be slower. In response to the end of the time period, the control circuit closes the switch 120SW and opens the switches 116SW, 118SW. In some embodiments, the switches 116SW, 118SW, 120SW are Complementary Metal Oxide Semiconductor (CMOS) field effect transistors. As such, the power transistor 102 can be controlled by switches 116SW, 118SW, 120SW, which are much smaller (at least 100 times smaller) than the power transistor 102.

Figure 5:
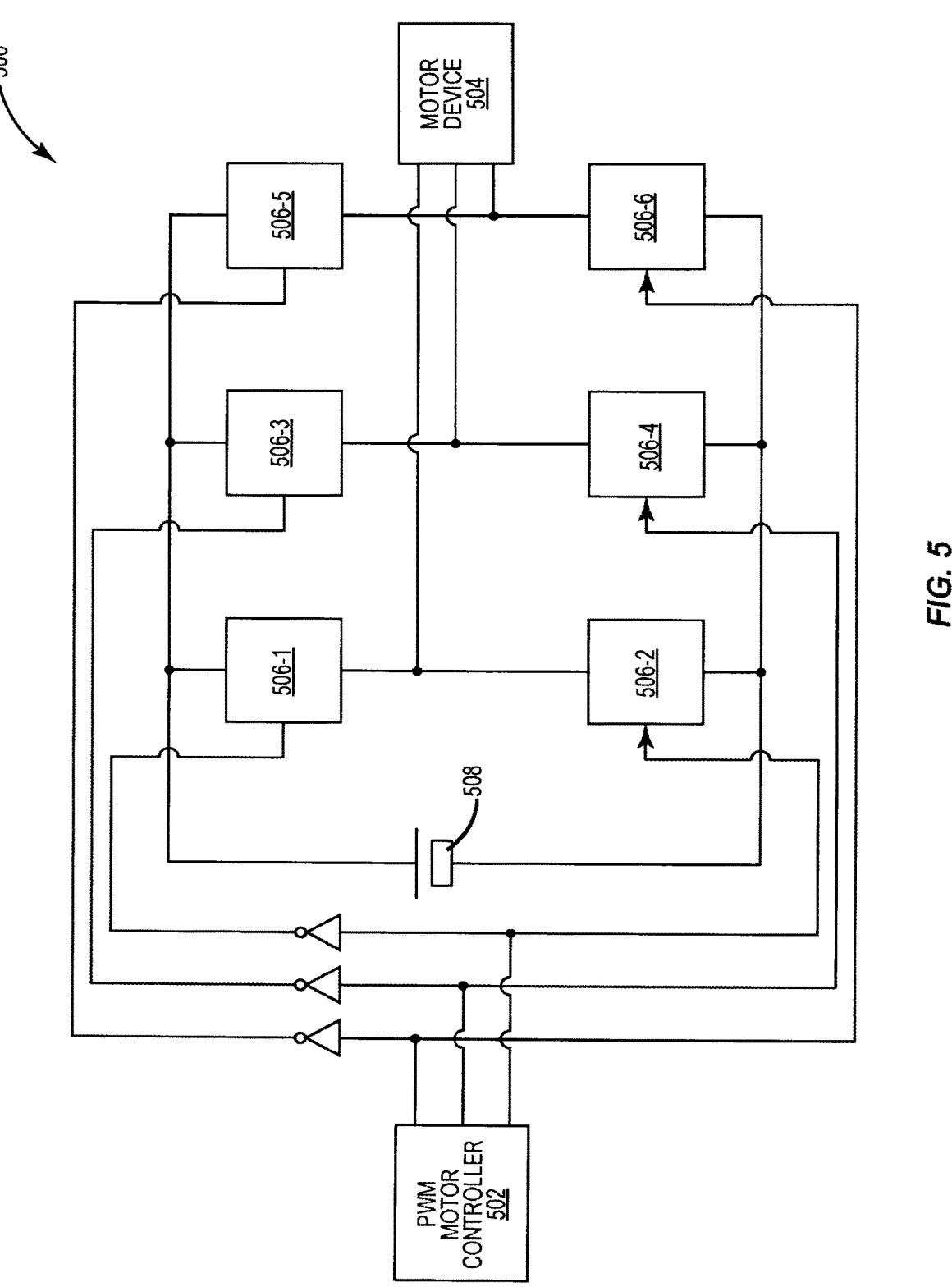
FIG. 5 is a user element, in accordance with some embodiments.

FIG. 5 illustrates one embodiment of a motor system 500, in accordance with some embodiments.

The motor system 500 includes a pulse width modulation (PWM) motor control system 502, a motor device 504, FET driving blocks (referred to individually as FET driving blocks 506-1, 506-2, 506-3, 506-4, 506-5, 506-6 and generically as FET driving blocks 506), and a power source 508.

In some embodiments, the power source 508 is a direct current (DC) supply, such as a battery. In some embodiments, the motor device 504 is a motor for an electric vehicle. The PWM motor controller 502 is configured to regulate the motor device 508 by adjusting the average power supplied to the motor device through the FET driving blocks 506. Each of the FET driving blocks 506 is configured to receive a power source voltage (e.g., VDD) from the power source 508. The motor device 504 is driven through a three phase motor control, wherein the FET driving blocks 506-1, 506-2 drive the first phase of the motor device 504, the FET driving blocks 506-3, 506-4 drive the second phase of the motor device 504, and the FET driving blocks 506-5, 506-6 drive the third phase of the motor device 504. The PWM motor controller 502 may include control logic that operates the FET driving blocks 506.

Figure 6:
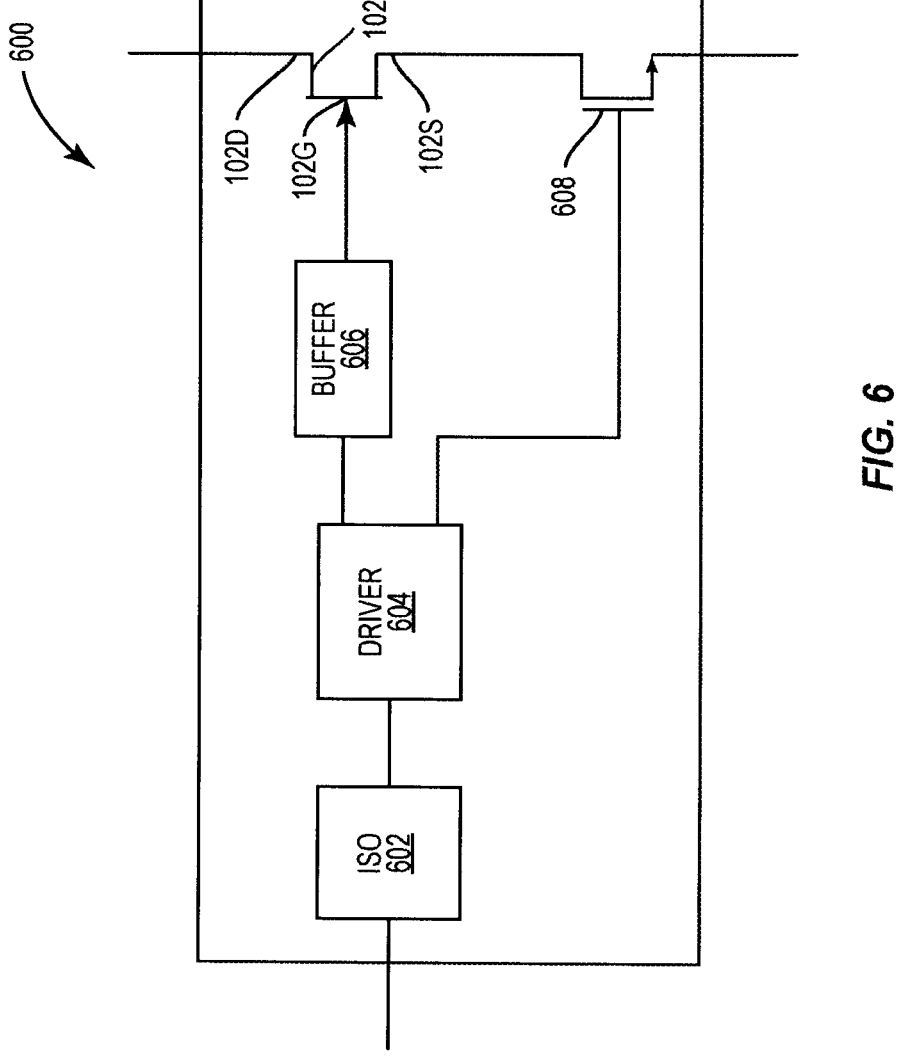
FIG. 6 is a FET driving block, in accordance with some embodiments.

FIG. 6 illustrates a FET driving block 600, in accordance with some embodiments.

In some embodiments, one, some, or all of the FET driving blocks 506 in FIG. 5 are provided in the same manner as the FET driving block 600. The FET driving block 600 includes an isolation 602, a driver 604, a buffer 606, and the power transistor 102. The isolation 602 is configured to isolate the FET driving block 600. The driver 604 is configured to drive the power transistor 102. In some embodiments, the buffer 606 includes the current buffer 104 and the driver circuit 106 as described above with respect to FIG. 1. In some embodiments, the current buffer 104 is provided as the current buffer 200 as shown in FIG. 2.

Those skilled in the art will recognize improvements and modifications to the preferred embodiments of the present disclosure. All such improvements and modifications are considered within the scope of the concepts disclosed herein and the claims that follow.

What is claimed is:

1. A power switching system, comprising:
a power transistor having a first control terminal, a first transistor terminal, and a second transistor terminal;
a current buffer is configured as a current amplifier that results in a voltage at the first control terminal, the current buffer having a second control terminal; and
a driver circuit having a first circuit branch connected to the second control terminal and a second circuit branch connected to the second control terminal, wherein:
the first circuit branch includes a first switch for opening and closing the first circuit branch; and
the second circuit branch includes a second switch and a first current source, wherein the second switch is configured to open and close the second circuit branch, and the first current source generates a first current having a first current level;
a third circuit branch including a third switch for opening and closing the third circuit branch and a second current source, wherein the second current source generates a second current having a second current level, and the second current level is less than the first current level.

2. The power switching system of claim 1, wherein the power transistor is a Silicon Carbide transistor or a Gallium Nitride field effect transistor.

3. The power switching system of claim 1, wherein the power transistor is a field effect transistor, wherein the first control terminal is a gate, the first transistor terminal is a source, and the second transistor terminal is a drain.

4. The power switching system of claim 1, further comprising a control circuit configured to:
close the second switch and open the first switch to generate a turn off voltage at a gate; and
open the second switch and close the first switch to prevent a Miller capacitance of the power transistor from activating the power transistor.

5. The power switching system of claim 1, further comprising a control circuit configured to:
detect that the power transistor is to be turned off;
close the second switch in the second circuit branch for a first time period in response to detecting that the power transistor is to be turned off and in response to detecting that a drain current of the power transistor is below a threshold current level; and
close the third switch in the third circuit branch for a second time period in response to detecting that the power transistor is to be turned off and in response to detecting that the drain current of the power transistor is above the threshold current level, wherein the second time period is longer than the first time period.

6. The power switching system of claim 1, wherein the current buffer further comprises:
a third control terminal;
a first current mirror comprising a first input N-channel field effect transistor (NFET) and a first output NFET, wherein the first input NFET is coupled to the third control terminal;
a second current mirror comprising an input P-channel field effect transistor (PFET) and an output PFET, wherein the input PFET is connected to the first output NFET; and
a third current mirror comprising a second input NFET and a second output NFET, wherein the second input NFET is coupled to the output PFET and the second output NFET is coupled to the first control terminal.

7. The power switching system of claim 3, wherein the current buffer comprises current mirror circuitry coupled between the second control terminal and the gate.

8. The power switching system of claim 6, wherein the power transistor is a Silicon Carbide junction field effect transistor (JFET).

9. The power switching system of claim 6, wherein the driver circuit is an integrated circuit (IC).

10. The power switching system of claim 6, wherein the power switching system is formed in an integrated circuit (IC).

11. The power switching system of claim 6, wherein the third circuit branch is connected to the second control terminal.

12. The power switching system of claim 7, wherein the current mirror circuitry comprises:
a first current mirror comprising an input P-channel field effect transistor (PFET) and an output PFET, wherein the input PFET is connected to the second control terminal; and
a second current mirror comprising an input N-channel field effect transistor (NFET) and an output NFET, wherein the input NFET is coupled to the output PFET and the output NFET is coupled to the gate of the power transistor.

13. The power switching system of claim 8, wherein the Silicon Carbide JFET includes a source, a drain, and a gate, wherein the gate is the first control terminal.

14. The power switching system of claim 9, wherein the current buffer is also part of the IC or a second IC.

15. The power switching system of claim 11, wherein the first switch is a first complementary metal oxide semiconductor (CMOS) switch, the second switch is a second CMOS switch, and the third switch is a third CMOS switch.

16. The power switching system of claim 13, wherein the first switch is a first complementary metal oxide semiconductor (CMOS) switch and the second switch is a second CMOS switch.

17. The power switching system of claim 15, wherein the power transistor is larger than the first CMOS switch, the power transistor is larger than the second CMOS switch, and the power transistor is larger than the third CMOS switch.

18. A method of operating a power transistor, the method comprising:

operating a current buffer as a current amplifier that results in a voltage at a first control terminal of the power transistor, the current buffer having a second control terminal;

detecting that a drain current through the power transistor is below a threshold current level while the power transistor is turned on;

in response to detecting that the drain current through the power transistor is below the threshold current level while the power transistor is turned on, opening a first switch and closing a second switch to generate a turn off voltage at the first control terminal and opening a third switch, a first circuit branch including the first switch for opening and closing the first circuit branch, a second circuit branch including the second switch and a first current source that generates a first current having a first current level, wherein the second switch is configured to open and close the second circuit branch, a third circuit branch including the third switch for opening and closing the third circuit branch and a second current source, wherein the second current source generates a second current having a second current level and the second current level is less than the first current level;

opening the second switch and the third switch and closing the first switch to prevent a Miller capacitance of the power transistor from activating the power transistor;

detecting that the drain current through the power transistor is above the threshold current level while the power transistor is turned on; and

in response to detecting that the drain current through the power transistor is above the threshold current level while the power transistor is turned on, closing the third switch and opening the first switch and the second switch to prevent the Miller capacitance of the power transistor from activating the power transistor.

19. A motor system that includes a field effect transistor (FET) driving block, the FET driving block comprising:

a power transistor having a first control terminal, a first transistor terminal, and a second transistor terminal;

a current buffer being configured as a current amplifier that results in a voltage at the first control terminal, the current buffer having a second control terminal; and a driver circuit having a first circuit branch connected to the second control terminal and a second circuit branch connected to the second control terminal, wherein:

the first circuit branch includes a first switch for opening and closing the first circuit branch; and the second circuit branch includes a second switch and a first current source, wherein the second switch is configured to open and close the second circuit branch, and the first current source generates a first current having a first current level;

a third circuit branch including a third switch for opening and closing the third circuit branch and a second current source, wherein the second current source generates a second current having a second current level, and the second current level is less than the first current level.

* * * * *